United States Patent [19]

Schenberg

[11] Patent Number: 4,935,706
[45] Date of Patent: Jun. 19, 1990

[54] TUNING APPARATUS FOR HIGH SPEED PHASE LOCKED LOOPS

[75] Inventor: Alan N. Schenberg, Kinnelon, N.J.

[73] Assignee: ITT Corporation, New York, N.Y.

[21] Appl. No.: 373,718

[22] Filed: Jun. 29, 1989

[51] Int. Cl.$^5$ .............................................. H03L 7/00
[52] U.S. Cl. ......................................... 331/11; 331/25
[58] Field of Search ...................... 331/1 A, 4, 10, 11, 331/16, 17, 25

[56] References Cited

U.S. PATENT DOCUMENTS 4,596,963  6/1986  Lawton et al. .................. 331/25 X Primary Examiner—Robert J. Pascal
Attorney, Agent, or Firm—Thomas N. Twomey

[57] ABSTRACT

A phase locked loop employed in a synthesizer includes a coarse tuning means to enable the VCO in the loop to be tuned within the acquisition range of the loop to thus enable the loop to fine tune the VCO to the desired output frequency. The coarse tuning means is removed from the loop when the VCO frequency is within the acquisition range.

17 Claims, 3 Drawing Sheets

TUNING APPARATUS FOR HIGH SPEED PHASE LOCKED LOOPS

BACKGROUND OF INVENTION

This invention relates in general to tuning apparatus particularly adapted for use with a phase locked loop (PLL) and more particularly to coarse tuning apparatus for a phase locked loop employed in a wideband frequency synthesizer.

A frequency synthesizer is a device which produces a plurality of synthesized output frequencies where each output frequency is locked to or derived from a stable master frequency source such as a crystal oscillator, atomic clock and so on.

The frequency synthesizer has been employed in radio receivers as the local oscillator and used in many other applications. The majority of modern day frequency synthesizers utilize the phase-locked loop (PLL) as an element in the synthesizer.

The PLL includes a phase detector, a low pass filter and a voltage controlled oscillator (VCO). The phase detector essentially is a linear device and its operating characteristics along with those of the low pass filter determine the overall loop performance of the phase-locked loop. Essentially the term PLL refers to a feed back loop in which the input and feed back parameters of interest are the relative phases of the wave forms. The function of a phase detector is to track small differences in phase between the input and feedback signals and to measure the phase difference between two inputs. The output of the phase detector is then filtered by means of a low pass filter and applied to the control terminal of a voltage controlled oscillator (VCO).

The VCO provides an output frequency which is a function of the control signal applied to its control terminal. In the PLL the VCO frequency changes in a direction that reduces the phase difference between the VCO signal and the reference signal. Such a loop is said to be in phase lock or locked when the phase difference is reduced to zero.

Since the frequency synthesizer is utilized in communication and test systems, the outputs available from the frequency synthesizer must be accurately specified and controlled. Therefore, one is concerned with frequency range, frequency resolution, frequency indication, frequency error, settling time, output power, harmonic distortion, phase noise, spurious interference, wide band noise and so on. Many of these factors are also associated with the phase-locked loop. It is therefore a desire to maintain low noise in the output of such a synthesizer as well as to optimize all the above characteristics for improved operation and performance.

In order to control the frequency of a synthesizer employing a phase-locked loop, coarse tuning systems are required to pretune the VCO output to within the loop acquisition frequency range prior to locking to a new frequency. The loop acquisition frequency range is the "lock in" or "pull in" range of the loop as a frequency range that will enable the loop to lock the VCO to the reference frequency at the desired frequency. If the VCO is not tuned within the acquisition range than the PLL will not lock to the reference frequency or may lock to an incorrect frequency. Thus, it is important to coarse tune the VCO so that a reliable locking at the desired frequency is assured. This is particularly important in wideband, fast switched frequency synthesizers which may be employed for military communications or other applications as well.

The prior art is aware of such approaches and essentially has referred to these approaches as coarse steering or coarse tuning. Wideband fast switching frequency synthesizers generally require a means for rapid coarse tuning of the VCO prior to closed loop acquisition at the new frequency. In regard to this, the object is to bring the VCO as close to the desired frequency as possible and then utilize the phase-locked loop to assure that the VCO will lock to the reference at the desired output frequency. Essentially, once the transfer characteristic of the VCO is known, it is possible to use a memory that stores frequency information and with the help of a digital to analog converter and, within given resolution, steer the oscillator towards its desired final frequency.

There are problems with such a system in regard to added noise at the synthesizer output. The means for providing coarse tuning should be such that the circuit is extremely "quiet" in operation. This means that the tuning means desirably should not contribute to the output spectrum of the synthesizer by adding additional noise or additional interfering signals. Thus the coarse tuning means provided with the PLL should not add to the existing phase noise of the oscillator loop. If this happens then the output spectral purity of the synthesizer will be degraded.

Fast switching wideband synthesizers cannot make use of the popular frequency discriminator phase detectors which improve acquisition range since the discriminators are inherently slow and noisy and thus are not suitable for high speed synthesizer applications. Generally speaking a wideband synthesizer would operate at frequencies of thousands of mHz over a relatively wide range of frequencies which may be, for example, from 1000 MHz to 1800 MHz or more. For examples of typical frequency synthesizers utilizing PLL devices, reference is made to a text entitled "Frequency Synthesis By Phase Lock" by William F. Egan, 1981, John Wiley & Sons, New York.

Thus, one object of the present invention is to provide apparatus which enables one to coarse tune a PLL synthesizer which apparatus does not add noise to the synthesizer output spectrum.

A further object of the present invention is to provide a tuning apparatus for a PLL frequency synthesizer which enables high speed switching operation of the synthesizer to thereby rapidly change the output frequency over a wide frequency range.

SUMMARY OF INVENTION

In a phase locked loop synthesizer having a voltage controlled oscillator (VCO) capable of providing an output signal at a controlled frequency by applying to a control terminal a control voltage, said control voltage provided by a phase detector having one input coupled to said VCO output and one input coupled to a reference frequency source to provide at an output an error signal, a loop integrator filter means responsive to said error signal for providing said control voltage, in combination therewith apparatus for coarse tuning said VCO comprising switching means coupled to said loop integrator filter means for operating said loop integrator filter means as a ramp generator for providing a ramp output signal in a first mode and for enabling normal operation as a loop integrator filter in a second mode, means coupled to said switching means to operate the same in said first mode for a coarse tuning command to vary said VCO output according to said ramp signal, comparator means having one input adapted to receive a reference signal indicative of a desired VCO output and another input coupled to the output of said loop integrator filter to provide at an output a signal when said ramp signal is relatively equal to said reference signal for applying said comparator output signal to said switching means to operate said switching means in said second mode, whereby said coarse tuning means are effectively removed from said loop during said second mode.

BRIEF DESCRIPTION OF DRAWINGS

The above objects and further features and advantages of the invention are described in detail below in conjunction with the drawings, of which.

DETAILED DESCRIPTION OF INVENTION

Figure 1:
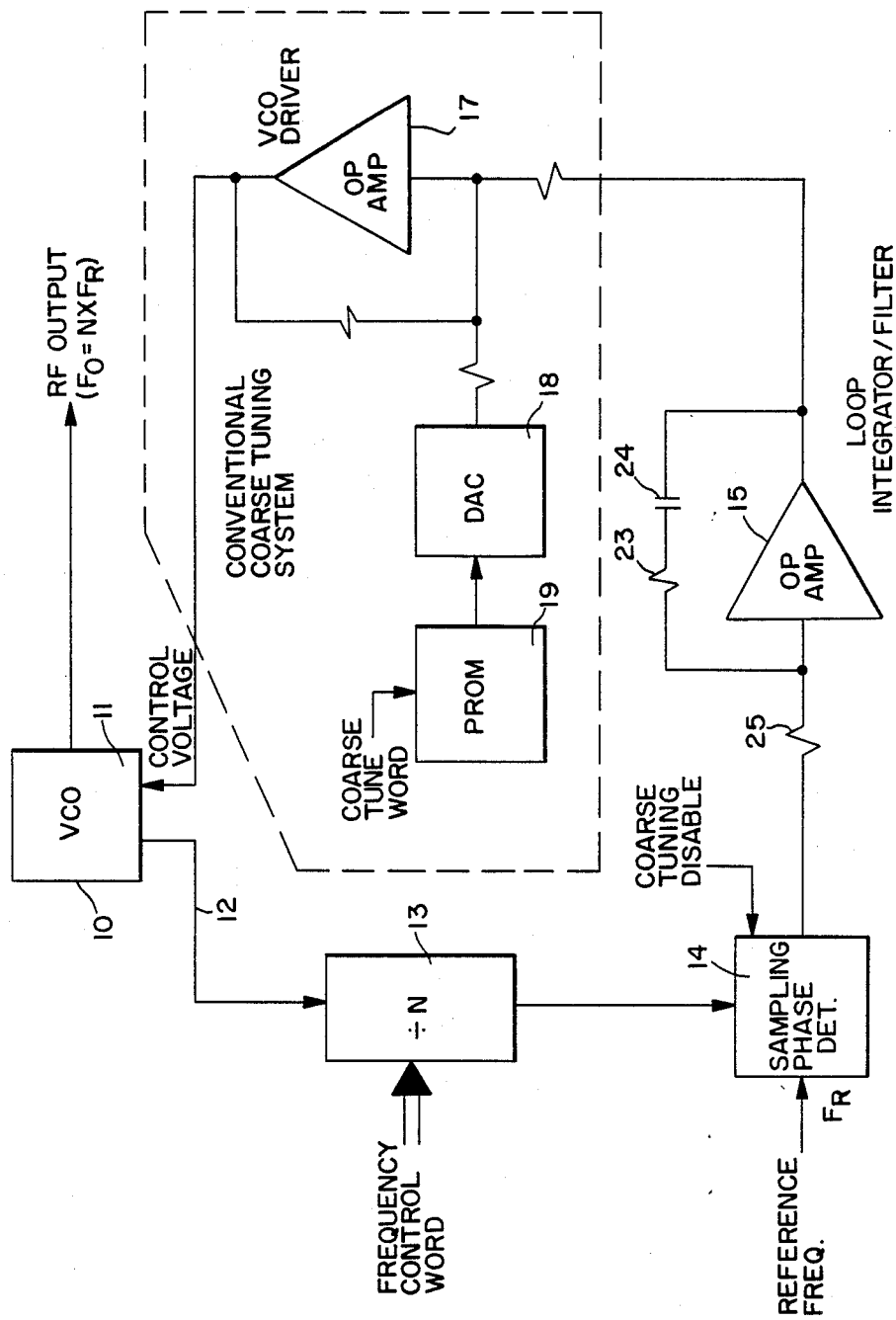
FIG. 1 is a block diagram of a prior art PLL synthesizer.

Referring to FIG. 1 there is shown a simplified block diagram of a PLL frequency synthesizer employing a conventional coarse tuning system according to the prior art. There is shown a voltage controlled oscillator or VCO 10. There are many examples of voltage controlled oscillators in the prior art which are utilized in conjunction with frequency synthesis or otherwise. Such oscillators, for example, may be controlled using switchable capacitors or variable reactance devices as controlled in terms of an input voltage. Devices which exhibit a charge in reactance as a function of an applied control voltage are well known and such devices have been utilized in conjunction with oscillator circuits to change or vary the output frequency.

The VCO conventionally supplies an output which is the RF output and which output is locked to a reference frequency. The reference frequency, designated as $F_r$ is applied to one input of a sampling phase detector 14. Phase detector 14 is also a well known circuit and essentially will provide an output signal or an error voltage in accordance with the difference in phase between the signals applied to the inputs thereof. The phase detector 14 receives one input, designated as the reference frequency $F_R$ which is supplied by means of a stable or master oscillator circuit, such as a crystal oscillator, atomic clock or other stable source. The output from the VCO as taken on lead 12 is applied to the input of a programmable frequency divider 13. Programmable frequency dividers which will divide by a selectable digit N, are well known and such dividers, for example, include synchronous and resettable counting devices and can be implemented in CMOS, ECL, or by other technologies. Such programmable dividers are available from many sources as conventional integrated circuits and are well known.

Thus, as can be seen, the sampling phase detector 14 receives the reference frequency at one input and the divided voltage controlled oscillator frequency at the other input. The phase detector produces an error signal at the output which is the difference in phase between the oscillator frequency and the reference frequency. This error signal is applied to the input of an operational amplifier 15 which is arranged to provide integration and filtering of the error signal. Such operational amplifier circuits 15 as used in conjunction with prior art PLL loops are also well known. The operational amplifier 15 contains a series resistance capacitance (RC) feedback network from input to output as resistor 23 and capacitor 24. A resistor 25 couples the input of the amplifier 15 to the output of the phase detector 14. The amplifier 15 is referred to as a loop integrator/filter due to the inclusion of resistor 23 in the feedback loop. The output of the operational amplifier is applied to the input of a VCO driver amplifier 17 whose output is coupled to the control voltage terminal 11 of the VCO 10. As one can ascertain, the VCO driver amplifier 17 supplies an amplified DC signal to the VCO 10 to control the frequency thereof.

Also coupled to the input of the operational amplifier 17 is a digital-to-analog converter circuit 18 having coupled to its input a programmable read only memory or PROM 19. The PROM 19 is a conventional component as is the digital-to-analog converter. As seen in FIG. 1, the PROM receives as an input a coarse tune word to enable coarse tuning of the VCO. The PROM 19 has stored in the storage locations digital words each of a given bit length which words when converted to an analog voltage will tune the VCO via the amplifier 17 to a coarse frequency according to the stored digital word as selected. The PROM 19 is addressed by the coarse tune word which is supplied by conventional means. The function of the coarse tune word is to provide a voltage to the VCO to assure that the VCO is within the acquisition range of the PLL. As can be seen from FIG. 1, the conventional coarse tuning system is shown as enclosed within the dashed line configuration and consists essentially of the PROM 19, the digital-to-analog converter 18 and the operational amplifier 17. These devices are conventional prior art and the system works as follows.

Initially the VCO 10 is prepositioned within the loop acquisition frequency range by entering a coarse tune word, which is a control word, to the input address terminal of the PROM 19. The PROM 19 has stored at the appropriate address therein a digital value indicative of the voltage which, when applied to the VCO 10 via the control terminal 11, will cause the VCO to produce an output within the acquisition range of the phase-locked loop. The acquisition range of the PLL is the range in which the VCO will be locked to the reference frequency to assure a proper output. It is important that the VCO be controlled in frequency to approach the desired output frequency within a value enabling the loop to lock the VCO to the desired output frequency.

Thus the digital output from the PROM 19 is applied to the input of the digital-to-analog converter 18. The digital-to-analog converter 18 converts the digital input word or signal into an analog signal. The analog signal is amplified via the high gain operational amplifier 17 which is the VCO driving summing amplifier. The amplifier 17 produces a control voltage which causes the VCO 10 to be properly tuned. Once coarse tuning is completed, the conventional coarse tuning system maintains a continuous stimulus at the input to the VCO driver amplifier 17 in order to keep the VCO tuned to the proper frequency. As one can ascertain, the operational amplifier 17 is a summing amplifier receiving one input from the digital-to-analog converter 18 and another input from the operational amplifier 15. It is also noted that the phase detector 14 is inhibited from operation during coarse tuning. This is a conventional approach to assure that the phase detector does not control the VCO during the coarse tuning mode.

It is the continuous operation of the coarse tune signal which degrades the synthesizer output spectral purity by injecting noise originating in the coarse tuning system and amplified by the VCO driver 17 directly into the tuning control port 11 of the VCO 10. A portion of this noise which lies within the bandwidth of the PLL is suppressed by feedback action in the closed loop. However, the higher frequency components lying outside the loop bandwidth are transmitted to the synthesizer output which essentially is the output of the VCO degrading output spectral purity.

As indicated, the VCO output designated as RF output can be assumed to be the synthesizer output. It is the output of the VCO which can be further processed by means of conventional dividing or multiplying circuits or other circuits to generate various signal frequencies all of which signals, will be locked to the reference frequency. Thus, as one can ascertain from FIG. 1, after completion of coarse tuning the phase detector 14 is enabled. The VCO output is divided by means of the digital divider 13. The divider 13 as indicated is a programmable divider and will divide by a factor N according to the input applied and designated as frequency control word. The frequency control word is a digital word of a given number of bits derived by conventional means from the synthesizer control circuit to indicate the frequency to be selected. The output of the digital divider is then compared with the reference frequency, as indicated, in the sampling phase detector 14. The output of the sampling phase detector provides an analog error signal which is proportional to the input phase differences.

The phase detector output, or error signal, is integrated in the loop integrator/filter including operational amplifier 15 whose output is then directed to the second input of the VCO driver amplifier 17 to provide fine tuning of the VCO output frequency. Thus when the VCO is in lock the phase detector output signal goes to zero to maintain the synthesizer output constant at the new desired frequency $(F_o)$ which is equal to N× the reference frequency or $N \times F_r$.

Another disadvantage inherent in the conventional coarse tuning system, as described in FIG. 1, is the presence of the VCO driver amplifier 17. This amplifier 17 appears within the synthesizer feedback loop and adds group delay which therefore reduces the synthesizer switching speed. As one will further understand, the conventional coarse tuning system, as described in conjunction with FIG. 1, adds noise to the VCO output and therefore adds noise to the synthesizer output spectrum. This is of course undesirable. Thus higher frequency noise components which lie outside the loop bandwidth are transmitted to the synthesizer output degrading the output spectral purity. The VCO driver amplifier 17 is a summing amplifier which receives the coarse analog voltage at one input and the "fine tune" voltage or integrated error voltage at the other input. These two voltages are present during operation and as indicated cause spectral noise to be generated.

Figure 2:
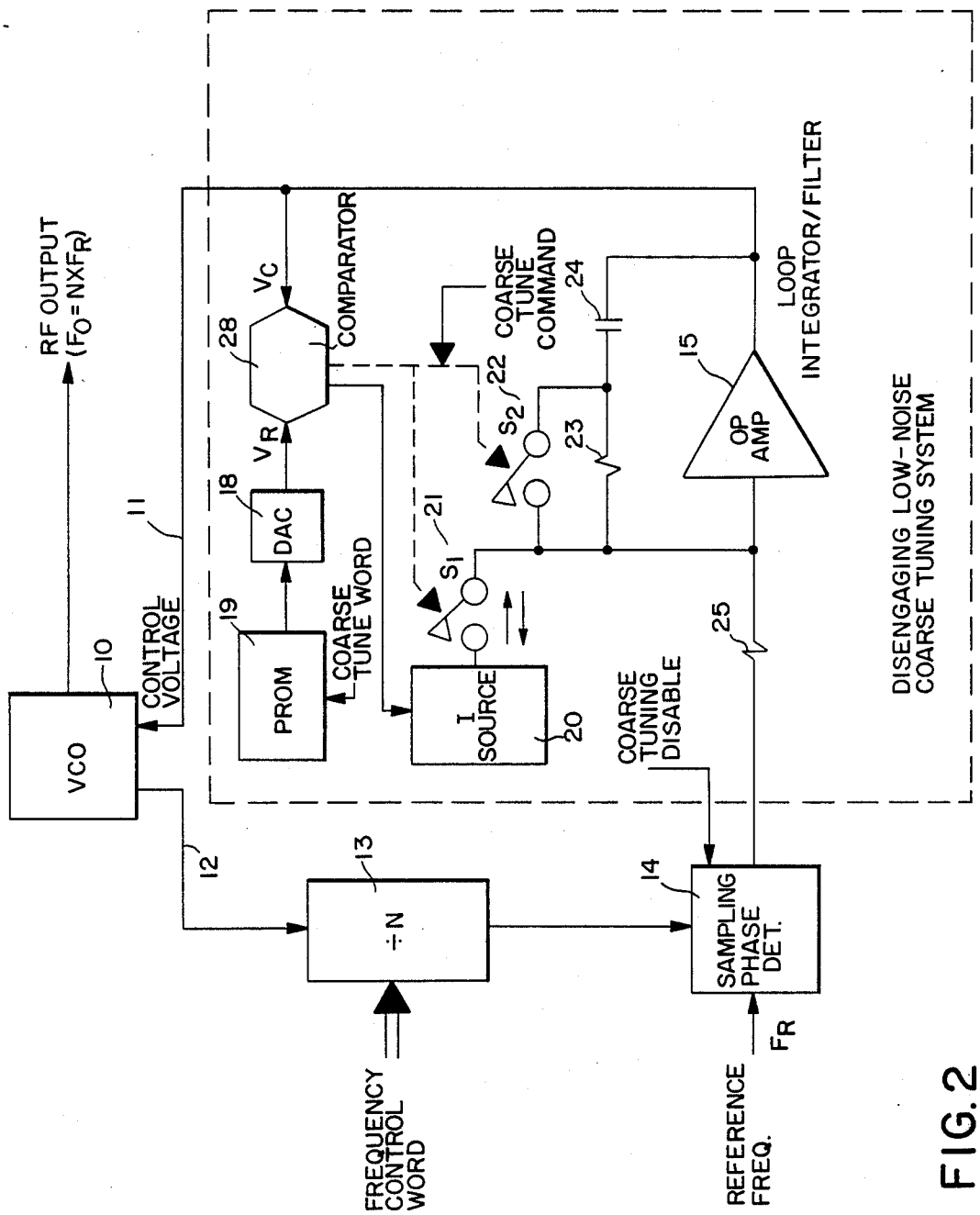
FIG. 2 is a simplified block diagram of a PLL synthesizer according to this invention.

Referring to FIG. 2 there is shown a simplified block diagram of a frequency synthesizer utilizing the tuning mechanism according to this invention. The simplified block diagram of the frequency synthesizer utilizes a coarse tuning system which is disengaged. The system shown in FIG. 2 provides a cleaner output spectrum and faster synthesizer switching speed when compared to synthesizers employing conventional coarse tuning apparatus as for example shown in FIG. 1.

The block diagram of FIG. 2 utilizes the same numerals to specify the same components for comparison of this circuit with that of the prior art. It is immediately seen that the system of FIG. 2 does not have the VCO driver 17 and includes switches 21 and 22, a current source 20 and a comparator 28. These components do not appear in the diagram of FIG. 1. The disengaging low noise coarse tuning system shown in FIG. 2 provides for the rapid repositioning of the VCO 10 while eliminating the drawbacks of the conventional system described in conjunction with FIG. 1. The elimination of the amplifier 17 from the loop results in the synthesizer having a faster switching speed as the amplifier does not provide the group delay indicated above.

In regard to the system shown in FIG. 2, the coarse tuning control voltage is provided by the loop integrator/filter including the operational amplifier 15 and applied to the control voltage input port 11 of the VCO 10. The capacitance of the loop integrator filter 15 operates as a memory and is utilized to maintain a proper coarse tuning control voltage at the input control port of the VCO until loop acquisition has occurred.

The system operates as follows. When a coarse tune command is first applied to the system which indicates to the system that a coarse tune word for example is to be applied to the PROM 19, switches 21 and 22 ($S_1$, $S_2$) are closed. The coarse tune command is an enable signal which is generated when the synthesizer is tuned to a new frequency. The PROM 19 receives the coarse tune word at its address input to access the PROM and provide the digital word at the output which word is converted to the analog reference signal $V_R$. The switches 21 and 22 are electronic switches and operate simultaneously to close in the coarse tuned mode. The closing of the switches 21 and 22 transforms the loop integrator filter 15 into a linear voltage ramp generator due to the fact that the resistor 23 is shorted out by switch 22. In this manner the operational amplifier 15 has its input and output connected by means of the capacitor 24. The capacitor 24 is charged under control of the current source 20 which has been inserted into circuit via switch 21. The ramp direction or polarity, as positive or negative slope, is controlled by the polarity of the current source which operates under control of the comparator 28 in such a manner as to tune the VCO in the proper direction. When the VCO reaches the proper coarse tuned frequency, a signal from the comparator 23 opens the switches 21 and 22 effectively disengaging the coarse tuning circuits and restoring the loop integrator/filter amplifier 15 to its original configuration. However, the loop integrator/filter output voltage has been charged to the proper control level for coarse tuning of the VCO and this level is maintained due to the inherent memory of the integrator/filter capacitor 24. This positions the VCO output within the loop acquisition frequency range permitting loop acquisition to occur in the manner as described in conjunction with FIG. 1. Accordingly, the phase detector 14 is now enabled to allow the PLL to lock the VCO in phase to the reference frequency. Thus the circuit shown in FIG. 2, in addition to providing a faster acquisition or switching speed, eliminates a great deal of noise from the loop since the coarse tuning system is disengaged prior to loop acquisition. This substantially reduces the noise level at the synthesizer output which greatly improves the spectral purity of the output signal.

Figure 3:
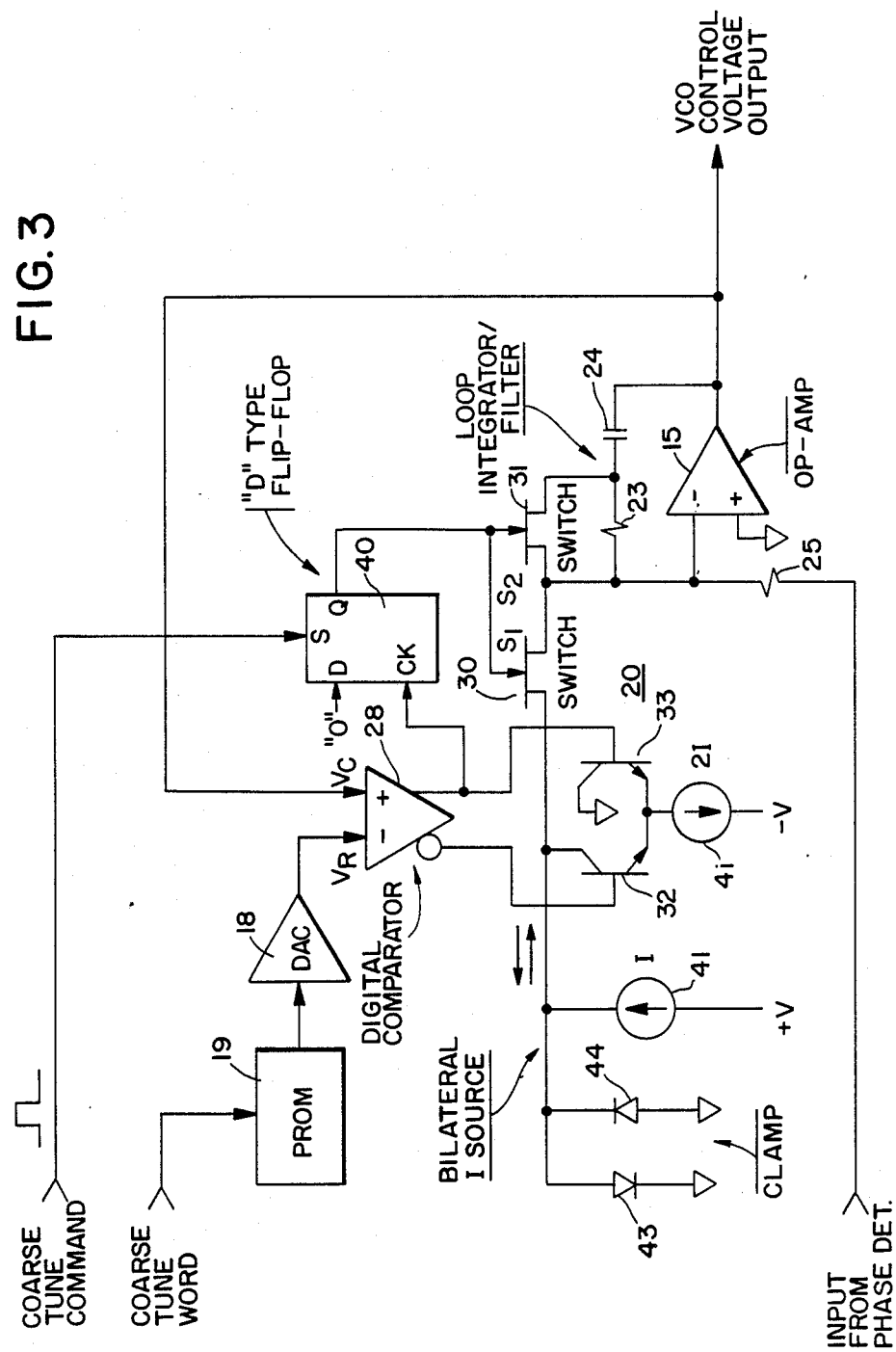
FIG. 3 is a more detailed block diagram of a low noise coarse tuning system for the PLL synthesizers of FIG. 2.

Referring to FIG. 3, there is shown a more detailed block and schematic diagram of the disengaging low noise coarse tuning system as depicted in FIG. 2. To enable one to more clearly understand the schematic of FIG. 3, the same reference numerals have been employed for corresponding parts as those in FIG. 2. As above indicated, in operation a coarse tune command pulse is received at the input of a D-type flip flop 40. The coarse tune command pulse is produced by the synthesizer each time a new frequency is to be tuned to and operates to set the flip flop 40 via the set input. This coarse tune command is the same command as shown in FIG. 2.

The flip flop 40 sets the Q output and biases switches S1 and S2 designated by reference numerals 30 and 31 to the On or conducting position. The switches are shown as FET devices which are biased on by the Q output of flip flop 40. Switch S2 by means of FET 31 completely bypasses or shunts resistor 23 to short the same out. The switch S1 indicated by reference numeral 30 connects the current source 20 to the input of the operational amplifier 15. The bypassing of resistor 23 in the operational amplifier 15 transforms the loop integrator/filter amplifier into a ramp generator which provides a control voltage to position the VCO at the desired frequency. The digital coarse tuning word inputs and addresses the PROM 19 which provides a stored digital word which corresponds to the desired VCO coarse tuned frequency. The PROM 19 upon receiving the coarse tune word outputs the digital code appropriate to the frequency characteristics of the specific VCO being employed. The digital code is then converted by means of the digital-to-analog converter 18 which outputs an analog reference voltage designated as $V_R$. This voltage corresponds to the VCO control voltage level needed to tune the VCO to the desired coarse tune frequency and hence to place the loop within the proper acquisition range. The reference voltage $V_R$ is directed to one input of the digital comparator 28. The second digital comparator input monitors the control voltage which goes to the VCO. Hence, as one can see, the output of the operational amplifier 15 is coupled to the plus terminal of the digital comparator 28. When the VCO control voltage differs from the reference voltage, the digital comparator 28 outputs a differential control signal to the bilateral current source which controls the direction of current flow through switch S1 to the input of the operational amplifier.

As one can see, the bilateral current source includes NPN transistors 32 and 33 having the emitter electrodes connected together and directed to a point of negative potential by means of a current source 42. The collector of transistor 32 is directed to a reference current source 41 and to a clamp circuit consisting of diodes 43 and 44. The collector of transistor 33 is grounded. The base electrode of transistor 32 is directed to one output of the digital comparator 28, while the base electrode of transistor 33 is directed to the other output of the digital comparator 28. The digital comparator 28 as indicated provides a differential control signal at the output which controls the direction of current flow through switch 30 to the input of the operational amplifier 15. This current flow causes the output VCO control voltage to constitute a ramp voltage which can provide a positive or negative slope until the voltage at the output of the operational amplifier 15 equals the reference voltage. At this point, a positive output transition from the digital comparator 28 is sent to the clock input of the D-type flip flop 40. This causes the output of the D-flip flop 40 to go low since a logic 0 is present at the "D" input.

The logic low signal at the Q output then opens switches S1 and S2 which terminates the ramp operation of the VCO control voltage and maintains the proper control voltage level at the VCO input via capacitor 24. In this manner the VCO is coarse tuned at the proper and desired frequency. The opening of switches S1 and S2 returns the ramp generator to its original configuration as a loop integrator/filter amplifier which permits normal closed loop acquisition to take place. During the coarse tuning interval, the loop phase detector is normally reset as shown in FIG. 2 so as not to interfere with the coarse tuning process.

Thus, as one can see, the circuit of FIG. 3 is implemented by conventional circuitry as all of the components shown and depicted in FIG. 3 are available as commercial integrated circuits from many different sources.

I claim:

1. In a wideband frequency synthesizer comprising a phase locked loop including a VCO having a control voltage terminal for providing a given signal frequency at an output upon application of a given voltage to said terminal, a phase detector having one input adapted to receive said VCO output and a second input for receiving a reference signal frequency for providing at an output an error signal indicative of the difference between said VCO signal frequency and said reference signal frequency, a loop integrator filter amplifier having an input coupled to the output of said phase detector and an output coupled to said control terminal of said VCO for controlling the frequency thereof; coarse tuning means coupled to said integrator filter amplifier for coarse tuning said VCO to bring the same within an acquisition range of a selected frequency; and means coupled to said coarse tuning means for removing said coarse tuning means from said phase locked loop when said VCO is tuned within said acquisition range, said means including switching means operative in a first coarse tuning mode to cause said integrator/filter amplifier to provide a ramp voltage to sweep said VCO output frequency signal towards said selected frequency within said acquisition range and to cause said amplifier to provide an integrator/filter operation during a second mode when said VCO is at said selected frequency within said acquisition range to enable said loop to fine tune said VCO at said selected frequency, wherein said coarse tuning means includes a memory means having a plurality of storage locations for storing in each location a digital word indicative of a coarse tuning frequency for said VCO, address means for addressing any of said locations according to a desired VCO frequency to provide a selected digital word at an output and a digital-to-analog converter having an input coupled to said output of said memory for converting said word to an analog reference voltage at an output, and a comparator having one input for receiving said analog reference voltage and one input for receiving said ramp signal to provide at an output an output signal when said voltage signal is relatively equal to the voltage of said ramp signal and means for applying said output signal to said switching means to operate the same in said second mode whereby said VCO is at said selected coarse frequency during said second mode.

2. The apparatus according to claim 1, further including a programmable frequency divider having an input coupled to the output of said VCO and an output coupled to one input of said phase detector said divider capable of dividing said VCO signal frequency by a factor of N.

3. The apparatus according to claim 1, wherein said memory means is a PROM.

4. The apparatus according to claim 1, wherein said integrator/filter amplifier includes a high gain operational amplifier having a series resistor/capacitor network between an input and an output of said operational amplifier, a current source coupled to said input terminal of said operational amplifier, with said switching means being operative in said first mode to shunt said resistor to cause said operational amplifier to provide said ramp signal, and means coupling said current source to said capacitor for providing said ramp signal according to the difference between said analog voltage and said ramp voltage.

5. In a phase locked loop synthesizer having a voltage controlled oscillator (VCO) capable of providing an output signal at a controlled frequency by applying to a control terminal a control voltage, said control voltage provided by a phase detector having one input coupled to said VCO output and one input coupled to a reference frequency source to provide at an output an error signal, a loop integrator filter means responsive to said error signal for providing said control voltage, in combination therewith apparatus for coarse tuning said VCO comprising:
   switching means coupled to said loop integrator filter means for operating said loop integrator filter means as a ramp generator for providing a ramp output signal in a first mode and for enabling normal operation as a loop integrator filter in a second mode,
   means coupled to said switching means to operate the same in said first mode for a coarse tuning command to vary said VCO output according to said ramp signal,
   comparator means having one input adapted to receive a reference signal indicative of a desired VCO output and another input coupled to the output of said loop integrator filter to provide at an output a signal when said ramp signal is relatively equal to said reference signal for applying said comparator output signal to said switching means to operate said switching means in said second mode, whereby said coarse tuning means are effectively removed from said loop during said second mode.

6. The combination according to claim 5, further including:
   a memory having a plurality of storage locations each containing a digital word indicative of a desired coarse output frequency for said VCO,
   means for applying a coarse tune word to said memory to cause a selected digital signal to appear at the output indicative of a selected VCO frequency,
   a digital to analog convertor having an input responsive to said selected digital signal for providing at an output an analog signal indicative of said reference signal for applying said analog signal to said one input of said comparator.

7. The combination according to claim 6, wherein said memory is a PROM.

8. The combination according to claim 5, further comprising a current source coupled to said switching means and operative to connect said source to said loop integrator filter means during said first mode to cause said loop integrator filter means to provide said ramp according to said current generator output, and
   means coupling said current generator to said comparator means for controlling said current generator means according to the comparator output signal.

9. The combination according to claim 5, further including a programmable divider having an input coupled to the output of said VCO for providing at an output said VCO signal frequency divided by N, with the output of said divider coupled to said one input of said phase detector, said divider capable of receiving a control signal for selecting said division factor N.

10. A coarse tuning apparatus for a wideband fast switching frequency synthesizer, comprising:
    a phase locked loop having a given acquisition range including a VCO having a control input for providing a signal frequency at an output according to a voltage applied to said control input, a programmable divider coupled to the output of said VCO to provide at an output said signal frequency divided by a factor N, a phase detector having one input coupled to the output of said divider and another input adapted to receive a reference frequency, for providing at an output an error signal of a value proportional to the phase difference between said reference frequency signal and said divided VCO signal an integrator/filter amplifier having an input coupled to the output of said phase detector and an output coupled to said control input of said VCO,
    switching means coupled to said integrator/filter amplifier to cause said amplifier to provide a ramp voltage at said output when said switching means is operated in a first mode, comparator means having one input coupled to the output of said amplifier and one input adapted to receive a reference voltage to provide a comparator output when said ramp voltage is relatively equal to said reference voltage for applying said output to said switching means to disable said ramp operation indicative of said VCO signal being within an acceptable acquisition range to enable said VCO to lock to said reference frequency to cause said VCO to provide an output frequency relatively equal to N times said reference frequency.

11. The apparatus according to claim 10, wherein said switching means includes a current generator coupled to said amplifier and said comparator to provide a current to said amplifier according to the difference between said reference voltage and said ramp voltage as determined by said comparator.

12. The apparatus according to claim 10, further comprising:
    a memory having stored at a plurality of storage locations digital words each indicative of a desired coarse frequency for said VCO, address means for addressing said memory at any one of said storage locations to provide a stored digital word at said output, a digital-to-analog converter having an input coupled to the output of said memory and an output for providing said reference voltage indicative of said desired coarse frequency to said input of said comparator.

13. The apparatus according to claim 12, wherein said memory is a PROM.

14. An improved tuning apparatus for a high speed phase locked loop synthesizer, comprising:

a voltage controlled oscillator (VCO) having an output terminal for providing an output signal at a selected frequency and a control terminal for receiving a control voltage operative to select the frequency of said output signal, said VCO located in a phase locked loop having a given acquisition range, including phase detecting means for comparing the phase of said output signal with the phase of a reference signal to provide at an output an error signal indicative of the differences therebetween, a loop integrator filter means responsive to said error signal to provide a control signal at an output according to said error signal and having said output coupled to said control terminal of said VCO for controlling the frequency of said VCO, coarse tuning means operative in a first mode to alter the configuration of said integrator filter means to cause said integrator filter means to provide a ramp output to sweep said VCO towards said selected frequency and operative in a second mode to restore said configuration of said integrator filter means to its original configuration when said VCO frequency is within the acquisition range of said loop, said coarse tuning means including a comparator for receiving at one input a reference voltage indicative of said VCO being within said acquisition range and for receiving said ramp output at said second terminal to provide a switching signal when said reference voltage is relatively equal to said ramp voltage, and switching means coupled to said integrator filter means for connecting said integrator/filter means as a ramp generator during operation of said coarse tuning means in said first mode with said switching signal coupled to said switching means to cause said switching means to restore said configuration during said second mode, whereby said coarse tuning means remains in said loop until said output signal of said VCO is controlled to be within said acquisition range of said loop.

15. The apparatus according to claim 14, wherein said integrator filter means comprises an operational amplifier having a series RC network from input to output and selected to provide integration and filtering, with said switching means operative to short said resistor in said first mode and to connect a current source to the input of said operational amplifier in said first mode.

16. The apparatus according to claim 15, further comprising a memory having a plurality of storage locations for storing in each location a digital word indicative of a coarse tuned frequency, addressing means for accessing a desired memory location for providing said stored digital word at an output, a digital-to-analog converter having an input coupled to the output of said memory for providing at an output an analog signal indicative of said reference voltage for applying said analog voltage to said comparator input.

17. The apparatus according to claim 16 wherein said memory is a PROM.

* * * * *